(12) United States Patent
Lin

(10) Patent No.: US 6,251,768 B1
(45) Date of Patent: Jun. 26, 2001

(54) METHOD OF ARRANGING THE STAGGERED SHAPE BOND PADS LAYERS FOR EFFECTIVELY REDUCING THE SIZE OF A DIE

(75) Inventor: Wei Feng Lin, Taipei (TW)

(73) Assignee: Silicon Integrated Systems Corp., Hsinchu (TW)

(*) Notice: Subject to any disclaimer, the term of this patent is extended or adjusted under 35 U.S.C. 154(b) by 0 days.

(21) Appl. No.: 09/264,109

(22) Filed: Mar. 8, 1999

(51) Int. Cl.$^7$ ................................................ H01L 21/44
(52) U.S. Cl. .......................... 438/617; 438/129; 438/612; 228/180.5
(58) Field of Search ............................... 257/784, 786, 257/700, 701, 758; 438/106, 612, 617, 622, 637, 638, 129; 228/180.5

(56) References Cited

U.S. PATENT DOCUMENTS

| | | | |
|---|---|---|---|
| 5,569,964 | * | 10/1996 | Ikebe .................................. 257/780 |
| 5,801,450 | * | 9/1998 | Barrow ................................. 257/784 |
| 5,814,892 | * | 9/1998 | Steidl et al. ......................... 257/784 |
| 6,008,532 | * | 12/1999 | Carichner ............................. 257/691 |
| 6,037,669 | * | 3/2000 | Shu et al. ............................. 257/786 |
| 6,040,984 | * | 3/2000 | Hirakawa ............................. 361/777 |

FOREIGN PATENT DOCUMENTS

| | | | |
|---|---|---|---|
| 63-252434 | * | 10/1988 | (JP) . |
| 1-107549 | * | 4/1989 | (JP) . |
| 3-34337 | * | 2/1991 | (JP) . |
| 4-199563 | * | 7/1992 | (JP) . |
| 4-361538 | * | 12/1992 | (JP) . |

* cited by examiner

Primary Examiner—Olik Chaudhuri
Assistant Examiner—Alonzo Chambliss

(57) ABSTRACT

A method of arranging staggered bond pads layers for effectively reducing the size of a die. The sizes of different bond pad layers are reduced gradually from the upper layer to the lower layer, while the sizes of traces in different layers are increased from the upper layer to the lower layers. The size of the first layer is specified and determined by the specification of a wire bonder. The reduction of different bond pad layers may be linear or nonlinear.

4 Claims, 7 Drawing Sheets

METHOD OF ARRANGING THE STAGGERED SHAPE BOND PADS LAYERS FOR EFFECTIVELY REDUCING THE SIZE OF A DIE

FIELD OF THE INVENTION

The present invention relates to a method of arranging staggered bond pads layers for effectively reducing the size of a die, in particular, to a method for reducing the size of a die with a specified opening suitable for a general wire bonder.

BACKGROUND OF THE INVENTION

For a semiconductor die, the circuit components within the integrated circuit core are connected with outer components through bond pads disposed on the surface of the die. In general, several hundreds of bond pads are distributed on the periphery of a die. There are two kinds of bond pad design, one is linear arrangement, the other is staggered arrangement. The linear bond pad arrangement is shown in FIG. 1. Only one bank of bond pads are disposed in one side of a die. For a linear arrangement, only finite number of bond pads are disposed in a die since if too many bond pads are arranged, the die area must be increased dramatically so that the cost of die is also increased largely. Another arrangement is staggered bond pad arrangement, wherein, each side has two banks of bond pads which are staggered, as shown in FIG. 2. The staggered bond pad arrangement has the advantage of compactness.

The staggered bond pads can be divided into a plurality of basic bond pad units having a shape of three staggered rectangles as that shown in FIG. 3, which is formed by three bond pads arranged as three staggered rectangles. In the basic unit, bond pads are spaced by a trace (classically, formed by the alloy of aluminum and copper) and a layer of dielectric material is filled between the bond pad and the trace as an insulator.

With reference to FIG. 4, in general, there are many layers of bond pads. Only the first layer is located on the surface of the die, which the other layer is embedded into the die. The bond pads of different layers are communicated through at least one via hole, while the whole bond pad layers are connected with the circuit component in the integrated circuit core through at least one contact hole. Then the surface of the die is enclosed by a passivation layer, only the bond pad opening of each bond pad is exposed outwards for communicating with other wires.

In the design of an integrated circuit, it is desired that the die area is small, since the smaller the die area, the greater the unit product amount in a chip unit, and accordingly the cost is reduced, However, the size of a die is mainly determined by the size of banks of bond pads. That is to say if we can reduce the size of the three staggered rectangle unit, then the size of the die is also reduced. For example, with reference to FIG. 3. if originally, in the basic bond pad unit, the size of a bond pad is X mils, while the distance of the different banks are 126um. I we can reduce further this distance by 10% both in longitudinal and transversal directions, then the whole size of the die is reduced by 10%, namely, 0.9 times of the original size, and the area is reduced to 0.81 times of the original area. That is, with the chip of the same size, the amount of product becomes 125% with an increment of 25%. Therefore, all the manufacturers of integrated circuits make a great effort to reduce the size of the die, since this may create large profit.

SUMMARY OF THE INVENTION

Accordingly, the primary object of the present invention is to provide a method of arranging bond pads layers having bond pad units each with a shape of three staggered rectangles for effectively reducing the size of a die. The sizes of different bond pad layers are reduced gradually from the upper layer to the lower layer, while the sizes of traces in different layers are increased from the upper layer to the lower layers. The size of first layer is specified and determined by the specification of a wire bonder. The reduction of different bond pad layers may be linear or nonlinear.

The various objects and advantages of the present invention will be more readily understood from the following detailed description when read in conjunction with the appended drawing.

DETAILED DESCRIPTION OF THE PREFERRED EMBODIMENTS

Figure 1:
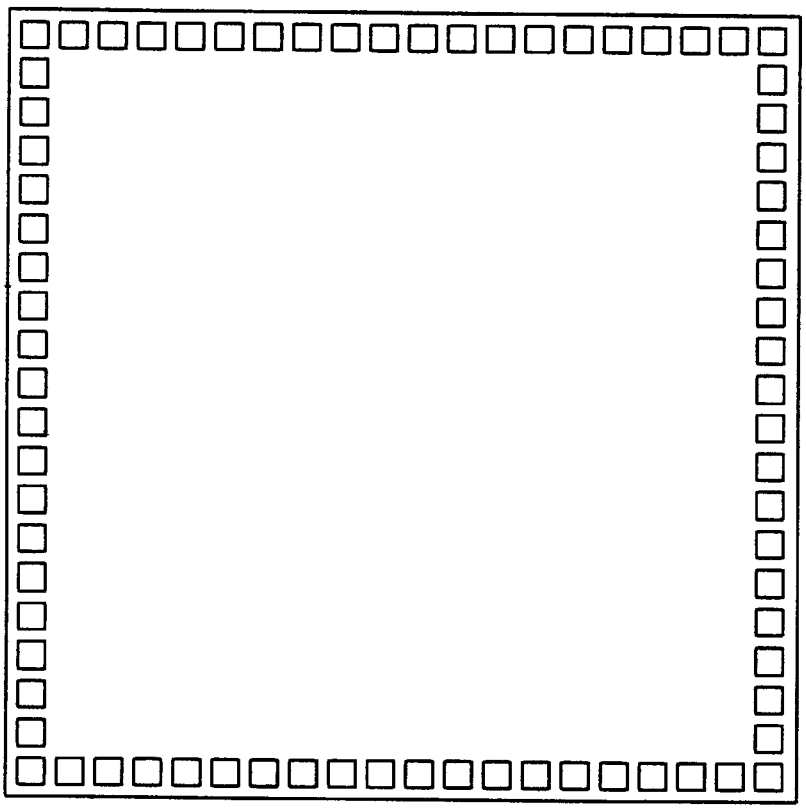
FIG. 1 shows a schematic view of a linear bond pad arrangement.
Figure 2:
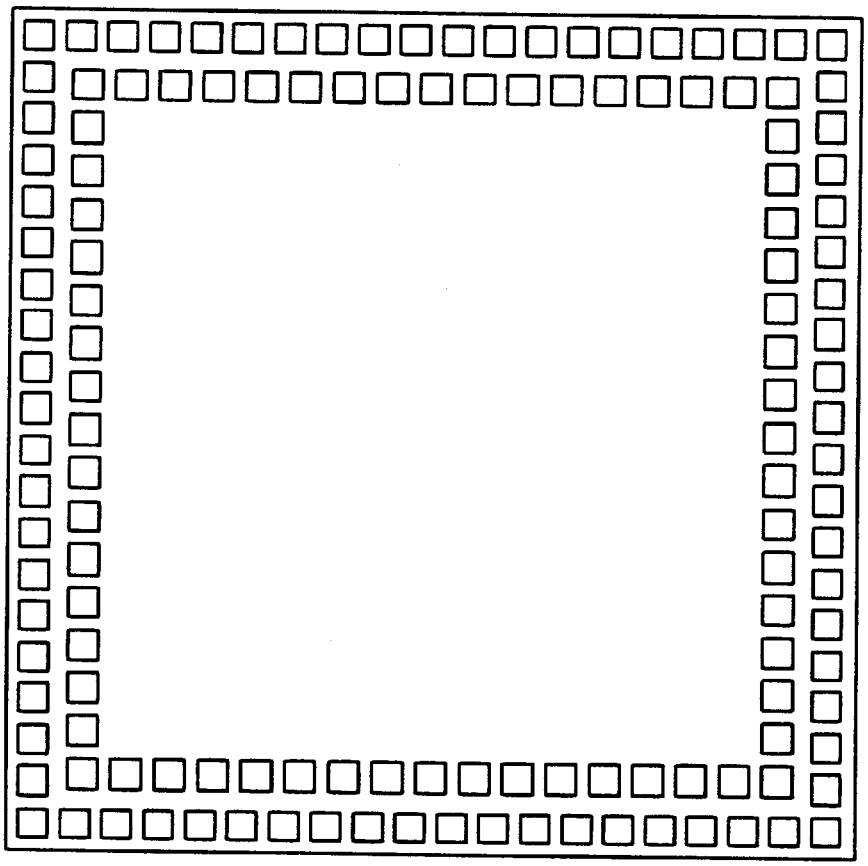
FIG. 2 shows a schematic view of a two banks bond pad arrangement.
Figure 3:
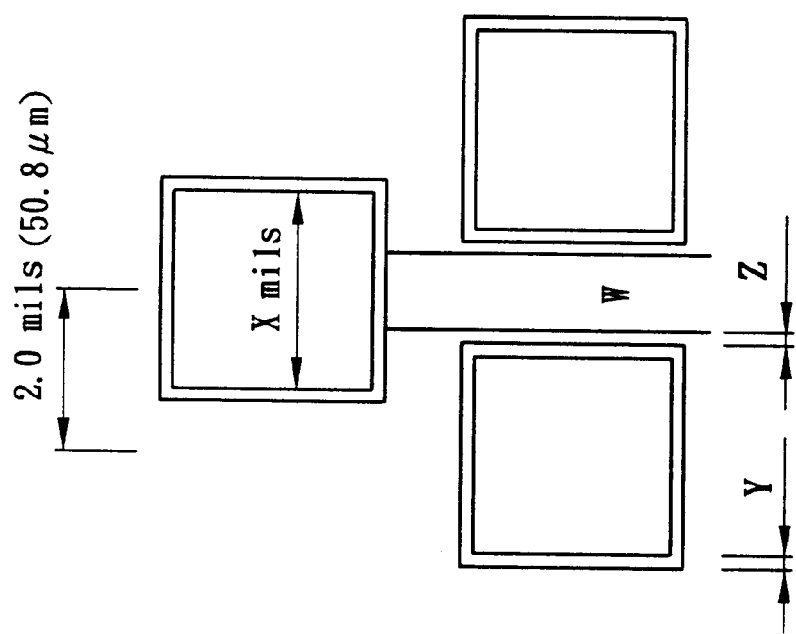
FIG. 3 shows a basic bond pad unit with a shape of three staggered rectangles in the prior art.

Before describing the embodiment of the present invention, a prior art bond pad structure is firstly described, thereby, one can easily understand the present invention. With reference to FIG. 3 a typically basic bond pad structure with a shape of three staggered rectangles in the package type of QFP is illustrated. The bond pad has a rectangular shape with an opening having a length X of 3.1 mils. The width Y of the passivation layer is 2 um. The width Z of the dielectric layer is also 2 um. While the width W of the trace is 12 um. The dimensions are listed in table I. Table I further lists the size of BGA packaging in the second column as a reference. It is apparent that from this structure, the bond pad pitch L is 2 mils.

TABLE I 1 mils = 25.4 um

|  | QFP | BGA |
| --- | --- | --- |
| X | 3.1 mils | 3.1 mils |
| Y | 2 um | 2 um |
| Z(Min) | 2 um | 2 um |
| W(Min) (top Metal) | 7 um | 7 um |

Figure 4:
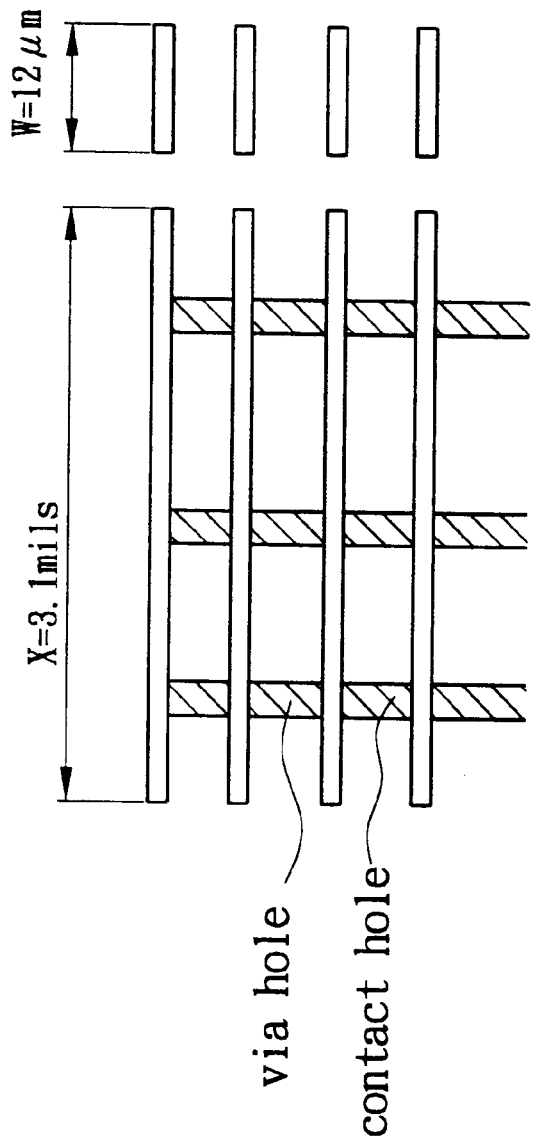
FIG. 4 shows a lateral view of the bond pad layers and traces in the prior art.

FIG. 4 shows a lateral structure of a plurality of bond pad layers, in which the via holes and contact holes are schematic. The number and shapes of the holes are not confined by that shown in the figure. However, they will not affect the result of the present invention. It is appreciated that this is the embodiment, since in which there are four bond pad layers.

If the size reduction is linearly performed, namely the length of the opening, passivation, dielectric layer, and trace are reduced linearly, for example, a 10% of reduction, then the length of the bond pad opening is reduced from 3.1 mils to 2.79 mils and the width of the trace is reduced from 12 um to 10.8 um. However, the reduction of the size of the opening will cause a great difficulty in packaging since the specification of the wire bonder is strictly confined. To change a wire bonder is very difficult and will greatly increase the cost. Therefore, a different design is required, by which the wire bonder is unnecessary to be changed, whereas the size of a basic bond pad unit can be effective decreased.

Figure 5:
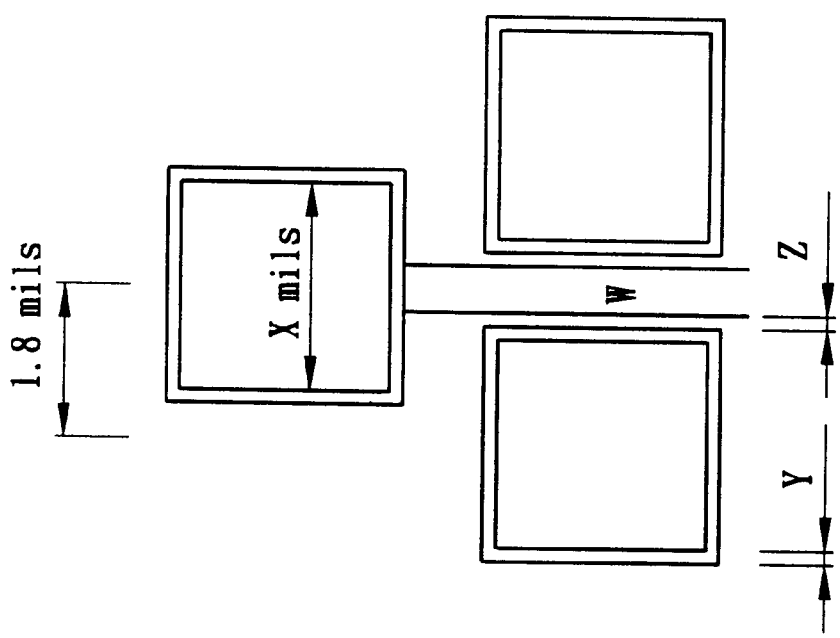
FIG. 5 shows a basic bond pad layer with having bond pad units each with a shape of three staggered rectangles in an embodiment of the present invention.

The novel design of the present invention is shown in FIG. 5, wherein the bond pad has a rectangular shape with an opening having a length X of 3.1 mils. The width Y of the passivation layer is 2 um. The width Z of the dielectric layer is also 2 um. The width W of the trace is 7 um. Comparing with the prior art shown in FIG. 3, it is apparent that only the size of trace W is changed from 12 um to 7 um. Therefore, the total width has been reduced from 2 mils to 1.8 mils, which is a 10% reduction.

However, reducing the length of the trace will decrease the ability of preventing mechanic shear stress. Therefore, it is necessary to enhance the mechanic strength.

Figure 6:
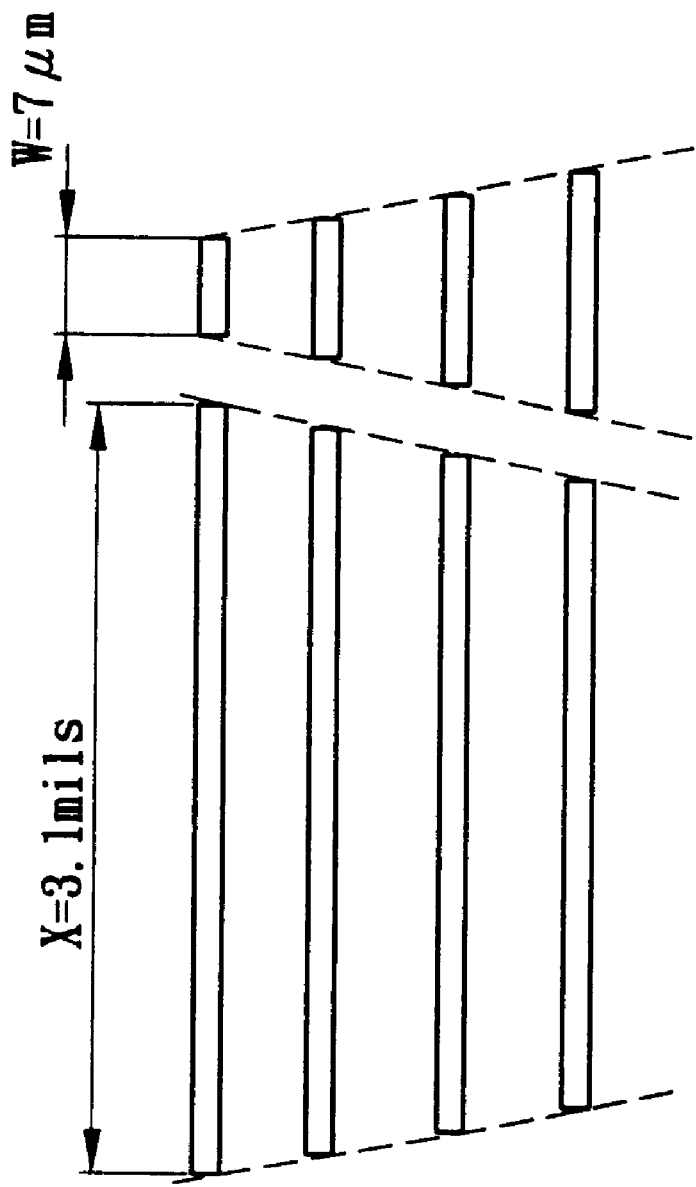
FIG. 6 shows a lateral view of the bond pad layers and traces in the embodiment of the present invention.

FIG. 6 shows the lateral view of the embodiment of the present invention, wherein for simplification, the via holes and contact holes have been omitted. As comparing to FIG. 4, it is appreciated that the embodiment of the present invention is a trapezoid profile. That is, the lengths of the bond pads are reduced from an upper layer to a lower layer, while inversely, the lengths of the traces are increased from the upper layer to the lower layer. The size for each layer is shown in TABLE II and TABLE III.

TABLE II

Sizes of bond pads in different layers
1 mils = 25.4 um

|  | Typical size (mils) | Present size (mils) |
| --- | --- | --- |
| 1st layer | 3.1 | 3.1 |
| 2nd layer | 3.1 | 3.0 |
| 3rd layer | 3.1 | 2.9 |
| 4th layer | 3.1 | 2.8 |

TABLE III

Sizes of trace in different layers
1 mils = 25.4 um

|  | Typical size (um) | Present size (um) |
| --- | --- | --- |
| 1st layer | 12 | 7 |
| 2nd layer | 12 | 8 |
| 3rd layer | 12 | 9 |
| 4th layer | 12 | 20 |

Therefore, the staggered bond pads arrangement of the present invention has the following advantages:

1. It can be used in a fine pitch staggered bond pad design, for example, in the pitch of 2.5 mils, 2.0 0mils, 1.8 mils, 1.6 mils, 1.4 mil, or the pitches smaller than 1.4 mils.

2. It can be used in a multiple layered wafer fabrication, such as 2, 3, 4, 5, . . . layers.

3. It can be used in the wafer process of 0.5 Sum, 0.35 um, 0.30 um, 0.25 um or smaller than 0.25 um.

Figure 7:
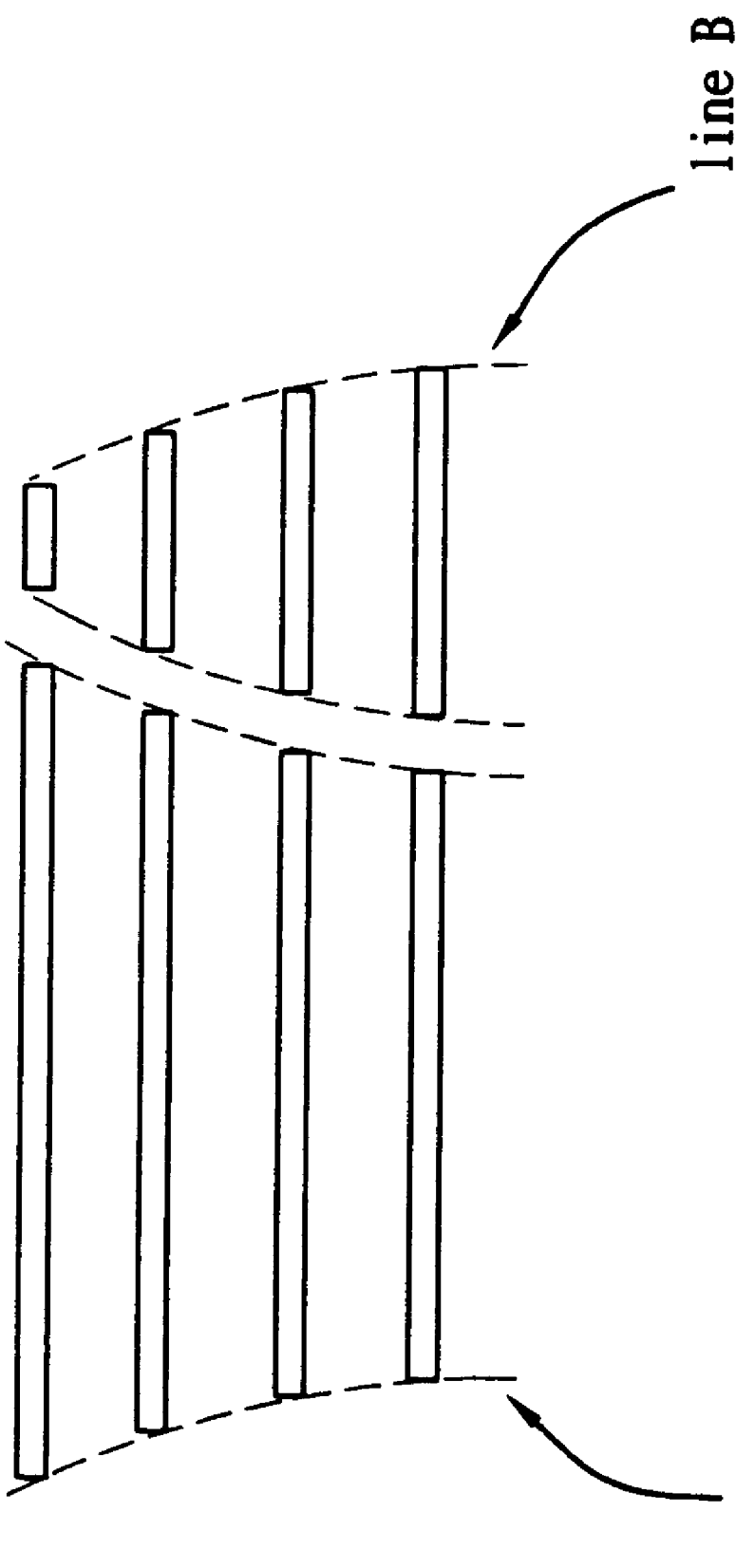
FIG. 7 shows a lateral view of the bond pad layers and traces in another embodiment of the present invention.

Although the present invention has been described with reference to the preferred embodiments, it will be understood that the invention is not limited to the details described thereof. Various substitutions and modifications have been suggested in the foregoing description, and others will occur to those of ordinary skill in the art. For example, the size reduction in different bond pad layers may be nonlinear, while other designs with the cambered shape can be suitable, as that shown in FIGS. 7. In FIG. 7, a lateral view of the bond pad layers is illustrated, wherein the sizes of the layers have a reduced size along a reduced concave cambered line A. As a consequence, the size variation of the traces is increased along a convex cambered line B matched to the shape of the outline connecting the bond pad layers. The only concern is that the mechanic structure, that is, the design of the structure must be suitable for the shear force and wire pulling force applied on the die.

Therefore, all such substitutions and modifications are intended to be embraced within the scope of the invention as defined in the appended claims.

What is claimed is:

1. A method of arranging staggered bond pads layers for effectively reducing the size of a die, wherein a bond pad structure is formed by different layers, a first layer is exposed on the surface of the die, while the other layers are embedded in the die, the other layers are communicated through at least one via hole and the bond pad structure is connected with circuit components in a core of the die through at least one contact hole, wherein the different bond pads in a same layer are spaced by traces, a dielectric material is disposed between the bond pads and traces, and the sizes of the different bond pad layers are reduced gradually from an upper layer to a lower layer while the sizes of the different layers are increased from an upper layer to a lower layer.

2. The method of arranging staggered bond pads layers for effectively reducing the size of a die as claimed in claim 1, wherein the size of the first layer is specified and determined by the specification of a wire bonder.

3. The method of arranging staggered bond pads layers for effectively reducing the size of a die as claimed in claim 1, wherein the reduction of different bond pad layers is linear, namely, the line connecting the edge of the same side of different bond pad layers is approximately a straight line.

4. The method of arranging staggered bond pads layers for effectively reducing the size of a die as claimed in claim 1, wherein the reduction of different bond pad layers is non-linear.

* * * * *